United States Patent [19]

Sugino et al.

[11] Patent Number: 4,520,485
[45] Date of Patent: May 28, 1985

[54] SEMICONDUCTOR DEVICE

[75] Inventors: Takashi Sugino, Takatsuki; Kunio Itoh, Uji; Masaru Wada, Takatsuki; Hirokazu Shimizu, Toyonaka, all of Japan

[73] Assignee: Matsushita Electric Industrial Co., Ltd., Kadoma, Japan

[21] Appl. No.: 357,086

[22] Filed: Mar. 11, 1982

[30] Foreign Application Priority Data

Mar. 17, 1981 [JP] Japan ................... 56-38957
Feb. 5, 1982 [JP] Japan ................... 57-17813

[51] Int. Cl.³ .................... H01S 3/19; G02B 5/174
[52] U.S. Cl. .................... 372/48; 350/96.12; 357/17; 372/45; 372/46
[58] Field of Search ............ 372/44, 45, 46, 48; 357/17; 350/96.12, 96.11, 96.15

[56] References Cited

U.S. PATENT DOCUMENTS 4,251,780 2/1981 Scifres et al. ................ 372/46
4,384,038 5/1983 Khoe et al. ................ 350/96.11

FOREIGN PATENT DOCUMENTS 56-110285 9/1981 Japan ................... 372/46

Primary Examiner—James W. Davie
Attorney, Agent, or Firm—Cushman, Darby & Cushman

[57] ABSTRACT

On a semiconductor laser substrate, a groove of tapered width is formed, and at least one crystal layer is formed on the substrate. The crystal layer is usable as a waveguide with two light input ends $l_1$ and $l_2$ and one light output end $l_3$ as shown in FIG. 4(C).

7 Claims, 18 Drawing Figures

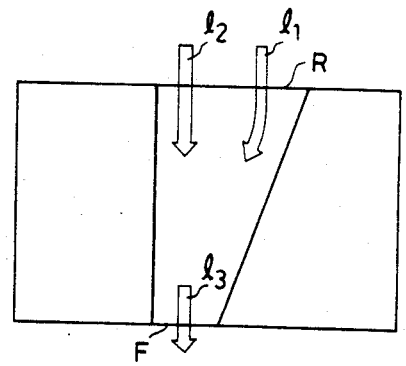
FIG.4(C)
FIG.4(A)
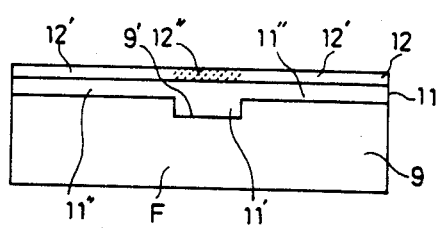
FIG.4(B)
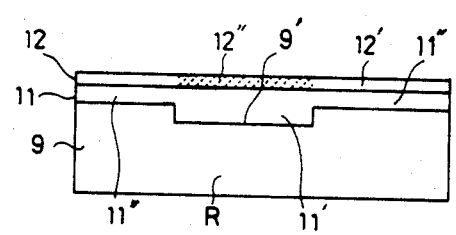
FIG.4'(A)
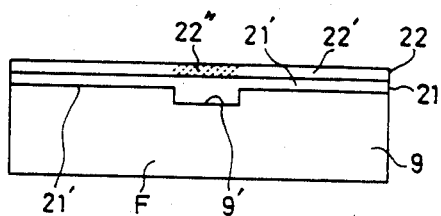
FIG.4'(B)
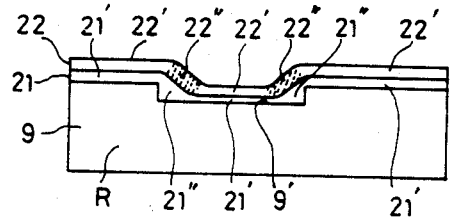
FIG.4'(C)
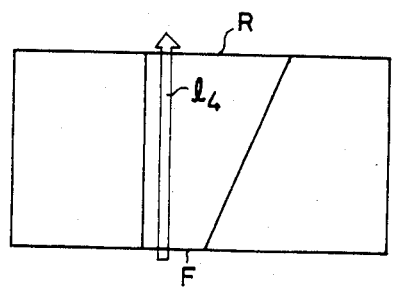

SEMICONDUCTOR DEVICE

BACKGROUND OF THE INVENTION

1. Field of the Invention:

The present invention relates to a semiconductor device having a waveguide thereon.

2. Description of Prior Art:

Hitherto, a semiconductor devices having a waveguide thereon are widely manufactured. As one exemplary embodiment of such conventional semiconductor device, a laser is shown in FIG. 1 wherein the following epitaxial growth layers are formed on a semiconductor substrate 1 having strip shaped groove 1' of n-GaAs:

a first clad layer 2 of n-$Ga_{1-x}Al_xAs$,
an active layer 3 of non-doped $Ga_{1-y}Al_yAs$,
a second clad layer 4 of p-$Ga_{1-x}Al_xAs$, and
a current limiting layer 5 of n-GaAs.

A strip shaped current injection region 6 is formed by Zn-diffusion from the surface of the current limiting layer 5 at a part above the groove 1'. A p-side ohmic electrode 7 and an n-side ohmic electrode 8 are formed on the current limiting layer 5 and on the bottom face of the substrate 1, respectively. By taking the above-mentioned configuration, the laser oscillates in the active layer 3, and the oscillated light is confined in the strip region defined above the groove 1' since the region has higher effective refractive index than other parts of the active layer 3. The light is emitted from both end faces of the active layer 3 in the direction perpendicular to the sheet of FIG. 1, with its plane of polarization parallel to the direction of the plane of the active layer 3. Accordingly, stable transverse mode oscillation is obtainable.

Some of the inventors proposed terraced substrate type lasers, and its one exemplary configuration is shown in FIG. 2 which was disclosed in the Japanese Patent non-examined publication No. Sho 56-110285 published Sept. 1, 1981 (Japanese Patent Application No. Sho 55-13159) which corresponds to a part of the disclosure of the U.S. patent application of Itoc et al. Ser. No. 224,821 filed on Jan. 13th, 1981, Pat. No. 4,392,227.

In the terraced substrate type laser the following epitaxial growth layers are formed on a semiconductor substrate 101 having a step 101' n-GaAs:

a first clad layer 2' of n-$Ga_{1-y}Al_yAs$,
an active layer 3' of n- or p-$Ga_{1-x}Al_xAs$,
a second clad layer 4' of p-$Ga_{1-y}Al_yAs$, and
a current limiting layer 5' of n-GaAs.

A strip shaped current injection region 6' is formed by Zn-diffusion from the surface of the current limiting layer 5' at a part above an oblique region 31' of the active layer 3' formed near and above the step 101'. A p-side ohmic electrode 7 and an n-side ohmic electrode 8 are formed on the current limiting layer 5' and on the bottom face of the substrate 1', respectively. By taking the above-mentioned configuration, the laser oscillates in the active layer 3' and the oscillated light is confined in the lasing region 31' defined above the triangular thick part of the first clad layer 2', since the lasing region 31' has a higher effective refractive index than other parts of the active layer 3'. Therefore, the oscillation light is emitted from both end faces of the lasing region 31' in the direction perpendicular to the plane of sheet of FIG. 2, with its plane of polarization parallel to the direction of the oblique lasing region 31'.

In both above-mentioned conventional embodiments, the active regions are strip shaped, that is, they have parallel boundaries in the active layer 3 or 3', accordingly, both ends of the active region or the cavity have substantially the same configuration each other.

SUMMARY OF THE INVENTION

The present invention is to provide a semiconductor device having a waveguide, which varies its configuration along its light path.

BRIEF EXPLANATION OF THE DRAWING

FIG. 4(A), FIG. 4(B) and FIG. 4(C) are set of a front view, rear view and a plan view of a semiconductor device made by utilizing the substrate of FIG. 3(c).

FIG. 4'(A) FIG. 4'(B) and FIG. 4'(C) are set of a front view, rear view and a plan view of a semiconductor device made by utilizing the substrate of FIG. 3(d).

DESCRIPTION OF THE PREFERRED EMBODIMENT

FIG. 3(a), FIG. 3(b), FIG. 3(c), FIG. 3(d), FIG. 4(A), FIG. 4(B), FIG. 4(C), FIG. 4'(A), FIG. 4'(B) and FIG. 4'(C) illustrate manufacturing and operation of a first group embodiment.

A semiconductor substrate, for example, a GaAs substrate 9 has a tapered groove 9' on its principal face of (100) plane. Then epitaxial growth is carried out to form a growth layer 10 shown in FIG. 3(b), FIG. 3(c) and FIG. 3(d), wherein (A) are front views seen in the direction of arrow A in FIG. 3(a), and (B) are rear views seen in the direction of arrow B in FIG. 3(a).

Figure 1:
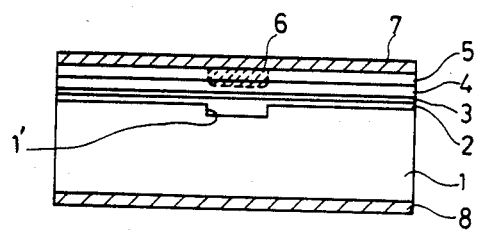
FIG. 1 is a front view of a conventional general type semiconductor laser.
Figure 2:
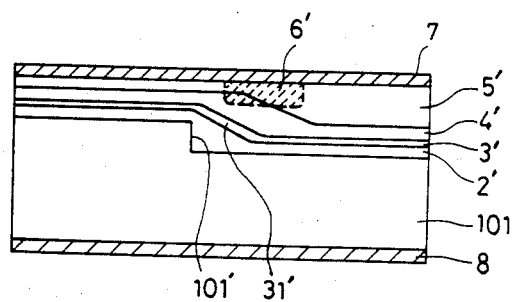
FIG. 2 is a front view of a conventional terraced substrate type semiconductor laser.
Figure 3A:
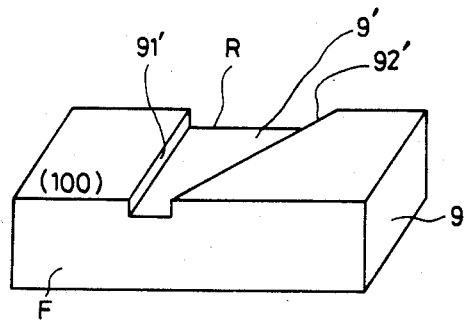
FIG. 3(a) is a perspective view of an example of a semiconductor substrate for use in an example of the present invention.
Figure 3B:
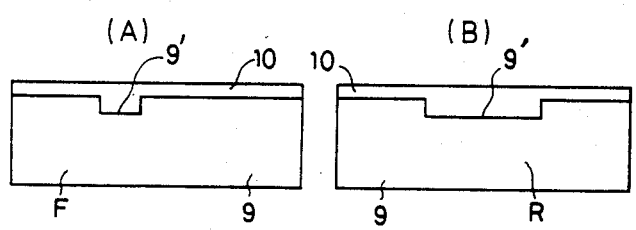
FIG. 3(b) is a set of a front view (A) and a rear view (B) of the device of FIG. 3(a), showing a first example of epitaxial growth of a layer 10 on its substrate 9.
Figure 3C:
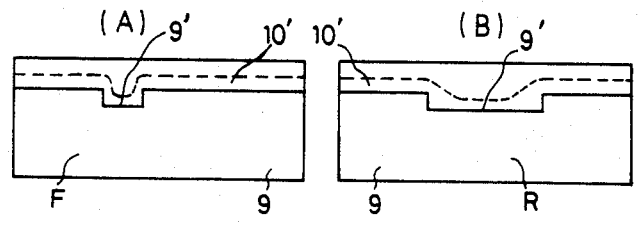
FIG. 3(c) is another set of a front view (A) and a rear view (B) of the device of FIG. 3(a), showing a second example of epitaxial growth of the layer 10 on the substrate 9.
Figure 3D:
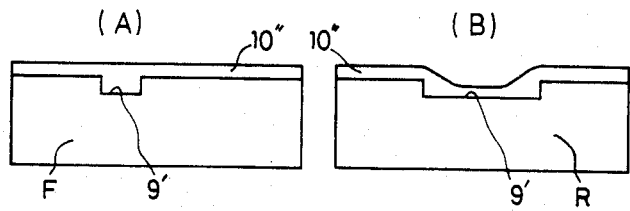
FIG. 3(d) is another set of a front view (A) and a rear view (B) of the device of FIG. 3(a), showing a third example of epitaxial growth of a layer 10 on its substrate 9.

When degree of supersaturation of a solution used in the epitaxial growth is selected small (for example, supersaturation by 2° C. to 3° C.), then the growth speed becomes larger at the part on the corner parts of the groove 9' than at the flat horizontal part, thereby forming a flat surface growth layer 10 on the groove 9' as shown by FIG. 3(b). On the contrary, when the degree of supersaturation is selected large (for example, supersaturation by 6° C. to 7° C.), then the growth speed at the flat horizontal part of the groove 9' becomes large and almost equal to that of the corner part, thereby is likely to form concave face on the groove 9' as shown by dotted lines in FIG. 3(c) at an early stage of the growth. Therefore, in order to obtain a flat surface of the growth layer 10', the growth must be made to have a larger thickness than the case of FIG. 3(b) as a solid line shown by FIG. 3(c). That is, the shape of flatness of the surface of the growth layer 10' varies depending on the degree of supersaturation of the solution and depth and width of the groove 9'. Accordingly, by utilizing this characteristic of the variation of the surface flatness of the growth layer 10', as shown by FIG. 3(d), a layer 10'' having different surface flatness at the front end (FIG. 3(d) (A)) and the rear end (FIG. 3(d) (B)) can be formed.

That is, the growth layer 10'' has a flat surface at the front end of the waveguide where the width of the groove 9' is narrower and a concave or sag surface at the rear end of the waveguide where the width of the groove 9' is wider. The present invention is characterized by fabricating a semiconductor device by utilizing the surface of the varying flatness. The invention is hereinafter elucidated more in detail referring to the following examples:

EXAMPLE 1

A first example shown by FIG. 4(A), FIG. 4(B) and FIG. 4(C) is elucidated. A semiconductor device in accordance with the present invention is fabricated by crystal growths on the substrate shown by FIG. 3(a) with the tapered width groove. This first example is a simple light waveguide made by the crystal growth on the semiconductor substrate.

First, a tapered width groove 9' is formed on a (100) plane of a GaAs substrate 9. One wall 91' of the tapered width groove 9' is selected to be in the direction of <011> direction, and the other wall 92' of the groove 9' is selected to be in the direction of 30° against the wall 91'. The depth of the groove is 1.5 μm. On this substrate, by means of sequential liquid phase epitaxial growth, a first growth layer 11 of n-type $Ga_{0.65}Al_{0.35}As$ and a second growth layer 12 of non-doped GaAs are formed. The epitaxial growth is carried out with the supersaturation of the solution at the starting of the growth of 2° C., with the temperature of the growth starting is 750° C. and with the cooling rate is 0.5° C./minute. Then, the tapered width groove 9' is filled with the first layer 11, surface of which is flat, and accordingly the second layer 12 becomes flat. The first layer 11 is formed 0.3 μm thick at the part outside the groove 9' and the second layer 12 is formed 0.5 μm thick.

In this configuration, the first growth layer 11 has thicker part 11' in the groove 9' and thinner part 11'' on the other parts. Therefore, by means of difference of effective refractive indexes between the parts above the thicker part 11' and the thinner part of the second growth layer 12, the region above the thicker part 11', i.e., the dot-line-hatched part of the second growth layer 12 forms light waveguide region 12''. Since the waveguide regions 12'' at the front end shown in FIG. 4(A) and that at the rear end shown in FIG. 4(B) have different widths, when inputting a wide input rays into the waveguide region 12'' from the rear end and taking out rays from the front end, matching efficiency with the optical fiber is increased. That is, by connecting the rear end of the waveguide region 12'' to the optical fiber (not shown), all the rays output from the optical fiber are introduced without loss into the waveguide.

When two or more light beams $l_1$ and $l_2$ are input from the rear end as shown in FIG. 4(C), a mixed light $l_3$ is taken out from the front end. The width of the narrower end (front end) can be designed to be about several to 10 μm, and that of the wider end (rear end) can be selected to be twice or three times thereof.

EXAMPLE 2

Another example of the present invention shown in FIG. 4'(A), FIG. 4'(B) and FIG. 4'(C) is elucidated.

The same substrate as of the Example 1 is used, and sequential liquid phase epitaxial growths are made with a larger supersaturation of 6° C. at the starting, the growth starting temperature of 750° C. and cooling rate of 0.5° C./minute. Then, the growth speed of the flat horizontal part of the first layer 21 increases to almost the same value as that of the corner part, and therefore the surface of the first layer 21 at the part near the rear end become concave as shown in the rear view of FIG. 4'(B), and FIG. 4'(A) and FIG. 4'(C) are front view and plan view of this example, respectively. Accordingly, the second layer 22 at the part of the rear end and the nearby part have oblique regions 22'', and this oblique parts 22'' are thicker than the flat horizontal parts 22'. In this example, the flat horizontal parts 21' of the first layer are 0.5 μm thick, and the corner parts thereof 21'' are about 1 μm thick; the flat horizontal parts 22' of the second layer are 0.5 μm thick and the oblique parts 22'' are 0.6 μm thick. Since the oblique parts 22'' of the second layer 22 are thicker than the flat horizontal parts 22', loss of light from these parts are smaller than the flat horizontal part. Since the effective index of the first layer is larger at the triangular section part 21'' contacting the oblique parts 22'' than that of the flat horizontal parts 21' contacting the flat horizontal part 22', the light is confined in the oblique parts 22''. That is, the oblique parts 22'' shown by dotted hatching of the second layer 22 form light waveguide. Therefore, when the light $l_4$ is input from the front end F of the second layer 22, then the light is led to the rear end R without diverging the rays, but the polarization plane of the light is gradually twisted as the light travels from the front end F where the waveguide part 22'' is disposed flat and horizontal to the rear end R where the waveguide part 22'' is disposed inclined as shown by FIG. 4'(B). Accordingly, by use of this semiconductor device, rotation of the polarization plane of coherent light beam can be made. Furthermore, the configuration of the device is suitable in combination with semiconductor laser device and/or semiconductor optical ICs since it can be formed on a semiconductor wafer by known method of substantially the same to the latters.

The semiconductor device of this example is usable for performing various function, such as discriminating two or more lights by discriminating the polarization thereof, thereby, for instance, configuring bi-directional amplifier or bi-directional modulator.

EXAMPLE 3

Figure 5A:
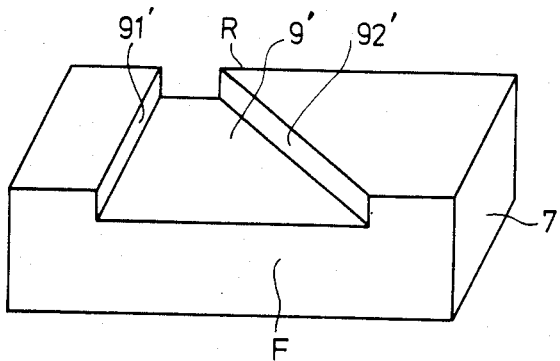
FIG. 5(a) is a perspective view of an example of a semiconductor substrate for use in another example of the present invention.

A semiconductor laser is produced embodying the present invention by utilizing the similar substrate 9 as that of FIG. 3(a). At first, an n-GaAs substrate 9 shown by FIG. 5(a) is etched to form tapered width groove 9' thereon, and the following layers are formed thereon by sequential liquid phase epitaxial growths:

a first clad layer 1020 of n-Ga$_{1-x}$Al$_x$As,
an active layer 1030 of non doped Ga$_{1-y}$Al$_y$As,
a second clad layer 1040 of p-Ga$_{1-x}$Al$_x$As, and
a current limiting layer 1050 of n-GaAs.

Figure 5B:
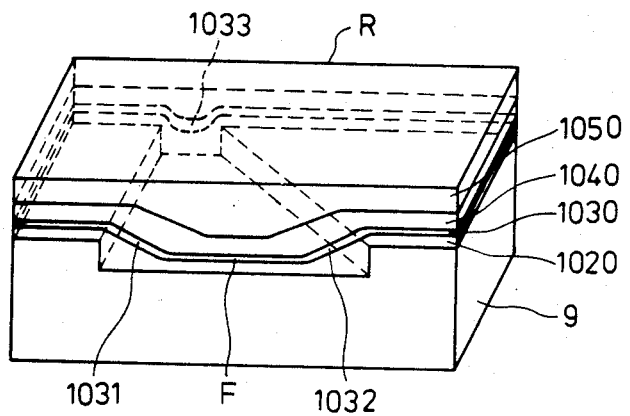
FIG. 5(b) is a perspective view showing an intermediate step of manufacturing of a semiconductor laser manufactured by utilizing the substrate of FIG. 5(a).

As shown by FIG. 5(b), the active layer 1030 is formed to have oblique regions 1031 and 1032 near the front end at above the corner part of the groove 9', and the oblique regions 1031 and 1032 are thicker than the flat horizontal parts of the active layer 1030. Oblique regions formed continuously from the oblique regions 1031 and 1032 at the front end part to the arch-shaped part 1033 at the rear end part of the wafer. Then, a strip shaped current injection region 6 is formed by Zn-diffusion from the surface of the current limiting layer 1050 at a part above the oblique region 1031 which is perpendicular to the front and rear end face of the wafer. The current injection region 6 is diffused to such a depth that a corner of the diffusion front penetrate the current limiting layer 1050 and remains in the second clad layer 1040 at the part above the oblique region 1031 which is perpendicular to the front and the rear faces of the wafer. A p-side ohmic electrode 7 and an n-side ohmic electrode 8 are formed on the current limiting layer 1050 and on the bottom face of the substrate 9, respectively. In the above-mentioned wafer, the active layer 1030 has the oblique regions 1031 and 1032 near the front end, and two oblique regions at the rear end where the groove is narrow, the two oblique regions each continuing from those of the front end becoming integral thereby forming an arch section part 1033 at the rear end. The oblique region 1031 and 1032 and the arch section part 1033 are thicker than other flat horizontal parts of the active layer 1030. Accordingly, light oscillated in the region under the current injection region 6 is confined in the thick region ranging continuously between the oblique part 1031 at the front end and the arch section part 1033 at the rear end, and therefore, by suitably selecting the width and depth of the groove 9' a fundamental transverse mode oscillation is obtainable in the active layer 1030. In this laser, the light emitted from the front end has the direction of the polarization in the direction of the sectional lines of the oblique region 1031 at the front end, while the light emitted from the rear end has the direction of the polarization in the horizontal plane (i.e., a plane parallel to the wafer surface). That is, the laser of FIG. 5(c) can emit two light beams of each other different polarization plane in opposite directions. There is no oscillation in the oblique region extending from the region 1032.

Figure 5C:
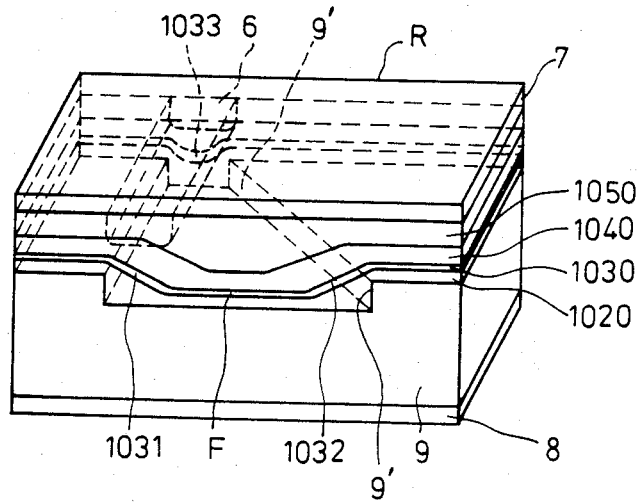
FIG. 5(c) is a perspective view of the semiconductor laser manufactured by utilizing the substrate of FIG. 5(a).

In the following, a method for manufacturing the laser of the Example 3 shown in FIG. 5(c) is elucidated more in detail.

First, a tapered width groove 9' is formed on a (100) plane of an n-GaAs substrate 9 having end faces (cleaving planes) of (01$\bar{1}$) plane. One wall 91' of the tapered width groove 9' is selected to be in the <01$\bar{1}$> direction, and the other wall 92' of the groove 9' is selected to be in the direction of 30° against the wall 91'. The depth of the groove 9' is 1.5 μm, and width of the groove 9' at the narrower end is 6 μm. On this substrate, by means of sequential liquid phase epitaxial growths, the first growth layer 1020 (first clad layer) of n-type Ga$_{0.6}$Al$_{0.4}$As, the second growth layer 1030 (active layer) of non-doped Ga$_{0.95}$Al$_{0.05}$As, the third layer 1040 (second clad layer) of p-Ga$_{0.6}$Al$_{0.4}$As and the fourth layer 1050 (current limiting layer) of n-GaAs are formed. The epitaxial growth is carried out with the supersaturation of the solution at the growth starting of 3° C., with the temperature of the growth starting of 800° C. and with the cooling rate of 0.5° C./minute. Thickness of the layers are as follows: The first layer 1020 at its flat horizontal part is 0.3 μm thick. The second layer 1030 is 0.08 μm thick at its flat horizontal part, 0.1 μm thick at its arch shaped part 1033 at the rear end, and 0.1 μm at its oblique parts 1031 and 1032 at the front end. The third layer 1040 at its horizontal part is 1 μm. The fourth layer 1050 at its horizontal part is 1 μm. The current injection region 6 is formed by diffusing Zn in a strip shape of 5 μm width in the <01$\bar{1}$> direction so that the diffusion front penetrates the fourth layer 1050, and the corner part reaches the second clad layer 1040. Then, a p-side Ti-PT-Au electrode 7 is formed on the fourth layer 1050. The wafer is etched to the wafer thickness of about 100 μm. Then, AuGeNi electrode 8 is formed as n-side electrode and alloying treatment is carried out. Then, by cleaving the wafer at predetermined positions to form a cavity, and the laser diode is completed.

The laser diode manufactured in the above-mentioned process oscillates in a fundamental transverse mode, and the polarization plane of the light emitted from opposite ends differed by 15° each other.

Figure 6:
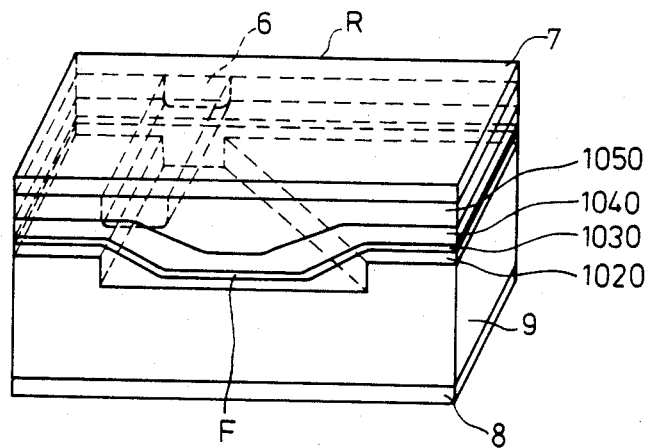
FIG. 6 is a perspective view of another semiconductor laser embodying the present invention.

FIG. 6 is another example manufactured by using a substrate to absorb the oscillated light, as in the GaAs-GaAlAs semiconductor device. In this example, the surface of the first clad layer 1020 is formed flat horizontal at the rear end, and the thickness of the first clad layer 1020 is made very thin, for example, below 0.2 μm at its flat horizontal parts. So that the oscillated light leaks through the first clad layer 1020 into the substrate 9. Therefore, effective refractive index of the active layer in its oblique region differs from that of the flat horizontal part, so that the light is confined in the oblique region and the strip-shaped part continuous thereto.

Figure 7:
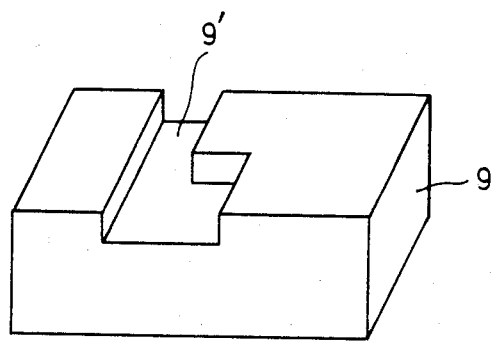
FIG. 7 is a perspective view of a semiconductor substrate to be used in another embodiment of the present invention.

FIG. 7 is another example of a substrate on which any of the semiconductor devices of the above-mentioned examples are to be fabricated.

Figure 8:
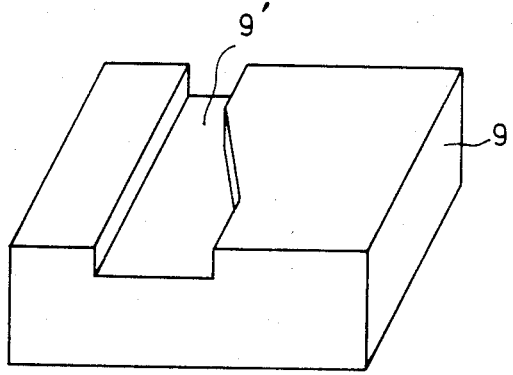
FIG. 8 is a perspective view of a semiconductor substrate to be used in still another embodiment of the present invention.

FIG. 8 is still another example of a substrate on which any of the semiconductor devices of the above-mentioned examples are to be fabricated.

As shown in the substrate 9 of FIG. 7 and FIG. 8, the tapered width groove 9' is modified to a partially tapered one or stepwise width one. That is, in order to achieve the effect of the present invention, it is enough that the groove 9' have tapered width, which can be so defined in this sence that the tapered width groove includes such groove as to change width along its length, either continuous or discrete.

What is claimed is:

1. In a semiconductor device the improvement comprising:
   a semiconductor substrate having a groove with widths differing at both ends on a principal surface, and a semiconductor crystal layer which is to serve as a waveguide and formed on all of said principal surface filling said groove.

2. A semiconductor device in accordance with claim 1, wherein a thickness of said semiconductor crystal layer is different between a part above said groove and other parts than said part.

3. A semiconductor device in accordance with claim 1, wherein said semiconductor crystal layer has an upper layer of larger refractive index and a lower layer of smaller refractive index, said upper layer constituting a light waveguide.

4. A semiconductor device in accordance with claim 1, wherein said semiconductor crystal layer has thicker parts at the corners of said groove than at other parts.

5. A semiconductor device in accordance with claim 3, wherein said upper layer has thicker parts at the corners of said groove than at other parts thereof.

6. A semiconductor device in accordance with claim 1, wherein said semiconductor crystal layer has a flat surface above a narrow groove portion and has a recessed surface above a wide groove portion.

7. In a semiconductor laser comprising:
- a semiconductor substrate having a groove with widths differing at both ends on a principal surface,
- a first clad layer of the same conductivity as said semiconductor substrate,
- an active layer of p- or n- conductivity type, and
- a second clad layer of the opposite conductivity to said semiconductor substrate,
- said first clad layer, said first active layer and said second active layer being formed on said main surface filling said groove.

* * * * *